(12) United States Patent
Manepalli et al.

(10) Patent No.: US 11,257,748 B2
(45) Date of Patent: Feb. 22, 2022

(54) SEMICONDUCTOR PACKAGE HAVING POLYMERIC INTERLAYER DISPOSED BETWEEN CONDUCTIVE ELEMENTS AND DIELECTRIC LAYER

(71) Applicant: Intel Corporation, Santa Clara, CA (US)

(72) Inventors: Rahul N. Manepalli, Chandler, AZ (US); Suddhasattwa Nad, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 73 days.

(21) Appl. No.: 16/623,328

(22) PCT Filed: Jun. 30, 2017

(86) PCT No.: PCT/US2017/040331
§ 371 (c)(1),
(2) Date: Dec. 16, 2019

(87) PCT Pub. No.: WO2019/005116
PCT Pub. Date: Jan. 3, 2019

(65) Prior Publication Data
US 2020/0273787 A1    Aug. 27, 2020

(51) Int. Cl.
*H01L 23/498* (2006.01)
*H01L 21/48* (2006.01)

(52) U.S. Cl.
CPC .... *H01L 23/49838* (2013.01); *H01L 21/4857* (2013.01); *H01L 23/49822* (2013.01); *H01L 23/49894* (2013.01)

(58) Field of Classification Search
CPC .......... H01L 23/49838; H01L 21/4857; H01L 23/49894; H01L 23/49822
See application file for complete search history.

(56) References Cited

U.S. PATENT DOCUMENTS 7,071,424 B1    7/2006 Shirai et al.
2001/0055203 A1    12/2001 Asai et al.
(Continued)

FOREIGN PATENT DOCUMENTS

WO    WO-2019005116 A1    1/2019

OTHER PUBLICATIONS

"International Application Serial No. PCT US2017 040331, International Preliminary Report on Patentability dated Jan. 9, 2020", 11 pgs.
(Continued)

*Primary Examiner* — Michael Jung
(74) *Attorney, Agent, or Firm* — Schwegman Lundberg & Woessner, P.A.

(57) ABSTRACT

The present disclosure provides a substrate for an integrated circuit. The substrate includes a dielectric layer. The substrate further includes a plurality of conductive elements at least partially embedded within the dielectric layer and having a substantially smooth outer surface. The substrate further includes an interlayer disposed between the individual conductive elements and the dielectric layer. The interlayer has a first surface comprising a plurality of protrusions interlocked with the dielectric layer and a second surface adhered to the outer surface of the individual conductive elements.

9 Claims, 3 Drawing Sheets

(56) References Cited

U.S. PATENT DOCUMENTS

| | | |
|---|---|---|
| 2006/0056162 A1 | 3/2006 | Koide |
| 2006/0131071 A1 | 6/2006 | Hiramatsu et al. |
| 2007/0030628 A1* | 2/2007 | Yamamoto ............. H05K 1/185 |
| | | 361/311 |
| 2008/0128288 A1 | 6/2008 | Hashimoto et al. |
| 2013/0081870 A1* | 4/2013 | Furutani ................ H05K 3/445 |
| | | 174/262 |
| 2014/0182907 A1* | 7/2014 | Lee .......................... H01G 4/30 |
| | | 174/258 |
| 2014/0186581 A1* | 7/2014 | Lee ........................ H05K 3/381 |
| | | 428/141 |
| 2016/0133555 A1* | 5/2016 | Nakamura ............. H05K 3/427 |
| | | 257/774 |

OTHER PUBLICATIONS

"International Application Serial No. PCT/US2017/040331, International Search Report dated Mar. 29, 2018", 5 pgs.

"International Application Serial No. PCT/US2017/040331, Written Opinion dated Mar. 29, 2018", 9 pgs.

* cited by examiner

SEMICONDUCTOR PACKAGE HAVING POLYMERIC INTERLAYER DISPOSED BETWEEN CONDUCTIVE ELEMENTS AND DIELECTRIC LAYER

CROSS-REFERENCE TO RELATED APPLICATION

This application is a U.S. National Stage Filing under 35 U.S.C. 371 from International Application No. PCT/US2017/040331, filed on Jun. 30, 2017, and published as WO 2019/005116, which application is incorporated herein by reference in its entirety.

BACKGROUND

Semiconductor packages include a number of different components. In order to ensure proper functioning, it is desirable for certain components to remain adhered to each other. However, ensuring adhesion between some components can result in increased signal loss in the package. It is desirable therefore to improve adhesion between components while mitigating signal loss.

BRIEF DESCRIPTION OF THE FIGURES

In the drawings, which are not necessarily drawn to scale, like numerals describe substantially similar components throughout the several views. The drawings illustrate generally, by way of example, but not by way of limitation, various embodiments discussed in the present document.

DETAILED DESCRIPTION

Reference will now be made in detail to certain embodiments of the disclosed subject matter, examples of which are illustrated in part in the accompanying drawings. While the disclosed subject matter will be described in conjunction with the enumerated claims, it will be understood that the exemplified subject matter is not intended to limit the claims to the disclosed subject matter.

Throughout this document, values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range. The statement "about X to Y" has the same meaning as "about X to about Y," unless indicated otherwise. Likewise, the statement "about X, Y, or about Z" has the same meaning as "about X, about Y, or about Z," unless indicated otherwise.

In this document, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, it is to be understood that the phraseology or terminology employed herein, and not otherwise defined, is for the purpose of description only and not of limitation. Any use of section headings is intended to aid reading of the document and is not to be interpreted as limiting; information that is relevant to a section heading may occur within or outside of that particular section.

In the methods described herein, the acts can be carried out in any order without departing from the principles of the disclosure, except when a temporal or operational sequence is explicitly recited. Furthermore, specified acts can be carried out concurrently unless explicit claim language recites that they be carried out separately. For example, a claimed act of doing X and a claimed act of doing Y can be conducted simultaneously within a single operation, and the resulting process will fall within the literal scope of the claimed process.

The term "about" as used herein can allow for a degree of variability in a value or range, for example, within 10%, within 5%, or within 1% of a stated value or of a stated limit of a range, and includes the exact stated value or range.

The term "substantially" as used herein refers to a majority of, or mostly, as in at least about 500/%, 60%, 70%, 80%, 90%, 95%, 96%, 97%, 98%, 99/%, 99.5%, 99.9%, 99.99%, or at least about 99.999% or more, or 100%.

Figure 1:
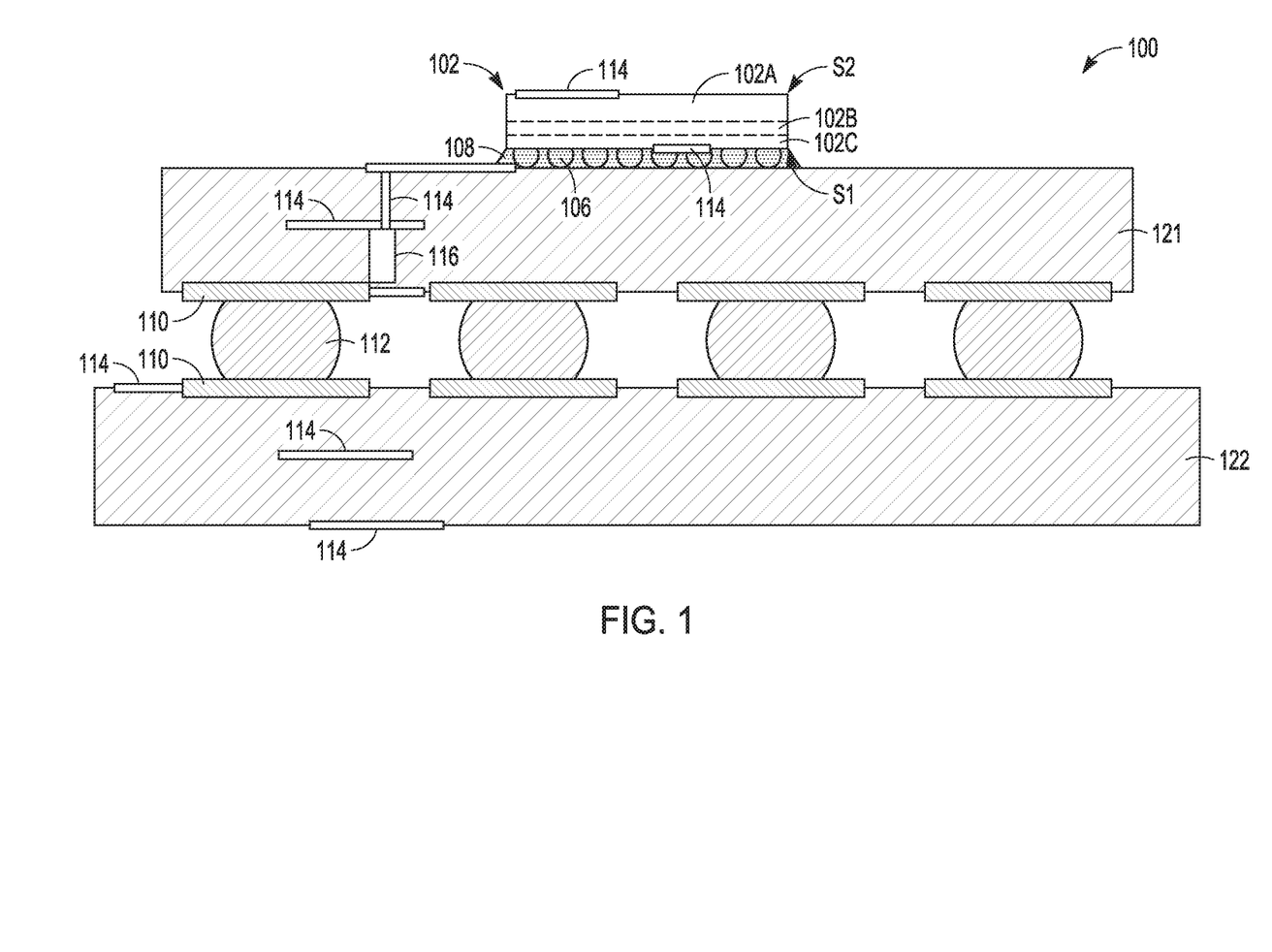
FIG. 1 is a schematic diagram of an integrated circuit package assembly, in accordance with various embodiments.

FIG. 1 schematically illustrates a cross-section side view of an example integrated circuit (IC) package assembly 100, in accordance with some embodiments. It should be noted that although FIG. 1 shows a "flip-chip" packaging architecture other architectures are contemplated. Non-limiting examples include embedded-bridge die architecture, three dimensional stacked dies, Si interposers, through silicon via architectures, and the like. In some embodiments, the IC assembly 100 may include one or more dies (hereinafter "die 102") electrically and/or physically coupled with a package substrate 121. In some embodiments, the package substrate 121 may be electrically coupled with a circuit board 122, as can be seen.

The die 102 may represent a discrete product made from a semiconductor material (e.g., silicon) using semiconductor fabrication techniques such as thin film deposition, lithography, etching, and the like used in connection with forming complementary metal-oxide-semiconductor (CMOS) devices. In some embodiments, the die 102 may be, include, or be a part of a processor, memory, SoC, or ASIC.

In some embodiments, an underfill material 108 (sometimes referred to as an "encapsulant") may be disposed between the die 102 and the package substrate 121 to promote adhesion and/or protect features of the die 102 and package substrate 121. The underfill material 108 may be composed of an electrically insulative material and may encapsulate at least a portion of the die 102 and/or die-level interconnect structures 106, as can be seen. In some embodiments, the underfill material 108 is in direct contact with the die-level interconnect structures 106.

The die 102 can be attached to the package substrate 121 according to a wide variety of suitable configurations including, for example, being directly coupled with the package substrate 121 in a flip-chip configuration, as depicted. In the flip-chip configuration, an active side, S1, of the die 102 including active circuitry is attached to a surface of the package substrate 121 using die-level interconnect structures 106 such as bumps, pillars, or other suitable structures that may also electrically couple the die 102 with the package substrate 121. The active side S1 of the die 102 may include transistor devices, and an inactive side, S2, may be disposed opposite to the active side S1, as can be seen. Other configurations besides a flip-chip configuration are possible.

The die 102 may generally include a semiconductor substrate 102*a*, one or more device layers (hereinafter "device layer 102*b*"), and one or more interconnect layers (hereinafter "interconnect layer 102*c*"). The semiconductor substrate 102*a* may be substantially composed of a bulk semiconductor material such as, for example, silicon, in some embodiments. The device layer 102*b* may represent a region where active devices such as transistor devices are formed on the semiconductor substrate 102*a*. The device layer 102*b* may include, for example, structures such as channel bodies and/or source/drain regions of transistor devices. The interconnect layer 102*c* may include interconnect structures that are configured to route electrical signals to or from the active devices in the device layer 102*b*. For example, the interconnect layer 102*c* may include trenches and/or vias to provide electrical routing and/or contacts.

In some embodiments, the die-level interconnect structures 106 may be configured to route electrical signals between the die 102 and other electrical devices. The electrical signals may include, for example, input/output (I/O) signals and/or power/ground signals that are used in connection with operation of the die 102. In some embodiments, the die-level interconnect structures 106 may include solder bumps formed according to techniques described herein.

In some embodiments, one or more traces 114 may be formed on the die 102 to route electrical signals of the die 102. The routing of signals, however, is not limited to traces 114, but may also include pads, pillars, blind micro vias, and the like. The one or more traces 114 may include copper traces formed according to techniques described herein. In some embodiments, the one or more traces 114 may be part of a redistribution layer formed on the first side S1 and/or the second side S2 of the die 102.

In some embodiments, the package substrate 121 is an epoxy-based laminate substrate having a core and/or build-up layers such as, for example, an Ajinomoto Build-up Film (ABF) substrate. In other embodiments, the package substrate 121 may be a circuit board such as, for example, a printed circuit board (PCB) formed using any suitable PCB technique. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, pads 110 or traces 114 disposed on one or more surfaces of the package substrate 121 and/or internal routing features such as, for example, trenches, vias, or other interconnect structures such as traces 114 to route electrical signals through the package substrate 121. For example, in some embodiments, the package substrate 121 may include electrical routing features such as pads (not shown) configured to receive the respective die-level interconnect structures 106 of the die 102.

The circuit board 122 may be a PCB composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper, and epoxy materials such as CEM-1 or CEM-3, or woven glass materials that are laminated together using an epoxy resin prepreg material. Interconnect structures (not shown) such as traces, trenches or vias may be formed through the electrically insulating layers to route the electrical signals of the die 102 through the circuit board 122. The circuit board 122 may be composed of other suitable materials in other embodiments. In some embodiments, the circuit board 122 is a motherboard.

Package-level interconnects such as, for example, solder balls 112 or bumps may be coupled to one or more pads (hereinafter "pads 110") on the package substrate 121 and/or on the circuit board 122 to form corresponding solder joints that are configured to further route the electrical signals between the package substrate 121 and the circuit board 122. The pads 110 may be composed of any suitable electrically conductive material such as metal including, for example, nickel (Ni), palladium (Pd), gold (Au), silver (Ag), copper (Cu), and combinations thereof. Other suitable techniques to physically and/or electrically couple the package substrate 121 with the circuit board 122 may be used in other embodiments.

In some embodiments, the circuit board 122 may include one or more traces 114 to route electrical signals on one or more surfaces of the circuit board 122 and/or through the circuit board 122. The one or more traces 114 may include copper traces formed according to techniques described herein, according to various embodiments.

The IC package assembly 100 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC package assembly 100 may be used in some embodiments.

As shown in FIG. 1, conductive elements such as traces 114 are at least partially embedded within the dielectric material. This is shown further in FIG. 2, which is a schematic sectional diagram showing layer 200 of traces 114 embedded within substrate 121. Substrate 121 can include any of the dielectric materials described herein. The dielectric material can independently range from about 50 wt % to about 100 wt % of at least one of dielectric layers 210 and 211, about 95 wt % to about 100 wt % of dielectric layers 210 and 211, less than equal to, or greater than about 50 wt %, 55, 60, 65, 70, 75, 80, 85, 90, 95, or 100 wt % of dielectric layers 210 and 211. Although shown as a single layer, either of dielectric layers 210 and 210 can include a plurality of individual layers of the dielectric material. In some examples, where dielectric layer 210 includes a plurality of individual layers, those individual layers of the dielectric material of layer 210 and 211 can include different dielectric materials or the same dielectric material.

Figure 2:
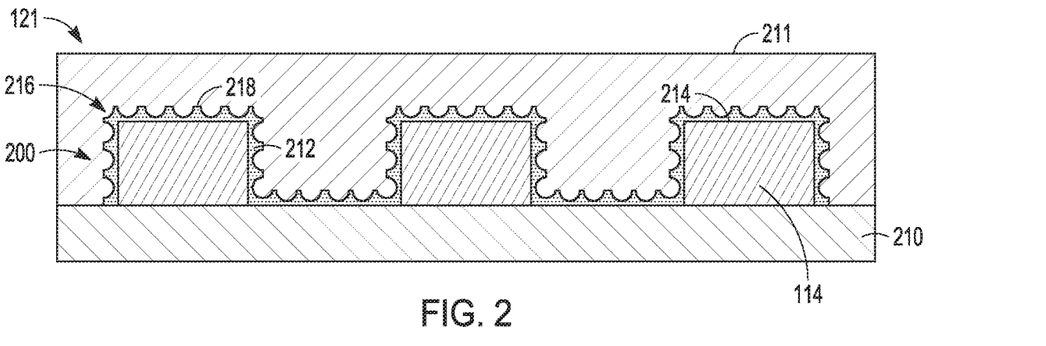
FIG. 2 is a schematic sectional view of a substrate of the integrated circuit package assembly of FIG. 1, in accordance with various embodiments.

As described herein, traces 114 include an electrically conductive material. That conductive material can be a metal. The metal can range from about 50 wt % to about 100 wt % of the conductive material, about 95 wt % to about 100 wt % of the conductive material, less than, equal to, or greater than about 50 wt %, 55, 60, 65, 70, 75, 80, 85, 90, 95, or 100 wt % of the conductive material. As shown in FIG. 2, the metal is copper. The copper has a substantially smooth outer surface. A root mean squared ($R_q$) surface roughness of trace 114 can be in a range of about 0.5 nm to about 100 nm, about 5 nm to about 15 nm, less than, equal to, or greater than about 0.5 nm, 1, 5, 10, 15, 20, 25, 30, 35, 40, 45, 50, 55, 60, 65, 70, 75, 80, 85, 90, 95, or 100 nm.

The roughness of trace 114 can have a direct effect on the loss of signal during conduction through trace 114. As understood, for a signal routed through trace 114, two factors can play a role in determining signal loss per length of trace 114. Those factors include roughness of trace 114 carrying the signal and dielectric loss of the build-up material surrounding trace 114. Although roughing trace 114 (e.g., 100 nm and greater) results in good adhesion between trace 114 and the dielectric material, signal losses (e.g., signal loss greater than 5 dB at 20 GHz) occur. However, if trace 114 is not roughed to a value of 100 nm or greater, adhesion between trace 114 and the dielectric material may not be strong. This can eventually lead to separation between trace 114 and the dielectric material.

To address this, at least in part, package substrate 121 includes interlayer 212. Interlayer 212 is disposed between traces 114 and dielectric layer 210. Interlayer 212 has first surface 214 and second surface 216. First surface 214 includes a plurality of protrusions 218, which are interlocked with dielectric layer 211. Second surface 216 is substantially smooth as compared to first surface 214, and is adhered to outer surface of traces 114. A root mean squared ($R_q$) surface roughness of first surface 214 can be in a range of about 0.5 nm to about 100 nm, about 5 nm to about 15 nm, less than, equal to, or greater than about 0.5 nm, 1, 5, 10, 15, 20, 25, 30, 35, 40, 45, 50, 55, 60, 65, 70, 75, 80, 85, 90, 95, or 100 nm. The surface roughness of trace 114 and first surface 214 can be the same or different. While interlayer 212 is shown as disposed on trace 114, interlayer 212 can be disposed on other non-polymeric components. Non-limiting examples of such components include a pad, a pillar, an integrated passive, an integrated active and the like.

As shown in FIG. 2, interlayer 212 extends over about 750% of the surface area of each trace 114. In other non-limiting examples, interlayer 212 can extend over about 0.01% surface area to about 100% surface area of each trace 114, about 50%/o surface area to about 60% surface area, less than, equal to, or greater than about 5% surface area, 10, 15, 20, 25, 30, 35, 40, 45, 50, 55, 60, 65, 70, 75, 80, 85, 90, 95, or 100% surface area of trace 114. Interlayer 212 can have a thickness ranging from about 0.1 µm to about 10 µm, about 1 µm to about 3 µm, less than, equal to, or greater than about 0.1 µm, 0.5, 1, 1.5, 2, 2.5, 3, 3.5, 4, 4.5, or 5 µm.

Interlayer 212 includes one or more polymers. Examples of materials applied through chemical vapor deposition or physical vapor deposition (e.g., a silicon nitride, a silicon oxynitride). Examples of suitable a polymer will be described herein. One desirable property of the one or more polymers is that they have sufficient adhesion to traces 114. Thus, a need to add a coupling agent or adhesion promoter to trace 114 to bind to interlayer 212 or dielectric layer 210 can be obviated. This can be beneficial in that coupling agents or adhesion promoters can result in increased signal loss in package substrate 121.

The one or more polymers can range from about 50 wt % to about 100 wt % of the interlayer, about 95 wt % to about 100 wt % of the interlayer, less than, equal to, or greater than about 50 wt %, 55, 60, 65, 70, 75, 80, 85, 90, 95, or about 100 wt % of interlayer 212. The one or more polymers of interlayer 212 can be any suitable polymer. Examples of suitable polymers can include a polyurethane, a polycarbonate, a polyamide, a polyimide, a polysiloxane, a polyacrylate, a cis-1,4-polyisoprene, an epoxy resin, a copolymer thereof, or a mixture thereof.

While not so limited, suitable examples of a polyacrylate include a polyacrylate chosen from a methacrylate, a methyl acrylate, an ethyl acrylate, a 2-cholroethyl vinyl ether, a 2-ethylhexyl acrylate, a hydroxyethyl methacrylate, a butyl acrylate, a butyl methacrylate, a polymethyl methacrylate, a copolymer thereof, or a mixture thereof. Examples of a suitable polyimide includes a polyimide that is formed according to a reaction of a dianhydride monomer and a diamine monomer or a dianhydride monomer and a disocynate monomer. While not so limited, examples of a suitable polycarbonate includes a polycarbonate is formed according to a reaction of a bisphonol A monomer and a phosgene monomer. While not so limited, a suitable example of a polyamide includes a polyamide chosen from an aliphatic polyamide, a polyphtalamide, an aramide, a copolymer thereof, or a mixture thereof. A suitable example of a polysiloxane is polydimethylsiloxane.

In examples of interlayer 212, which include a polymer formed from an epoxy resin, suitable polymers include those formed from a bisphenol A epoxy resin, a bisphenol F epoxy resin, a novolac epoxy resin, an aliphatic epoxy resin, a glycidylamine epoxy resin, or mixtures thereof. The epoxy resin can include an end group chosen from an amine, an anhydride, a polyphenol, a thiol, or a mixture thereof. The epoxy resin can also be hardened in the presence of a hardener. The hardener can be chosen from a primary amine, an anhydride, a polyphenol, a thiol, or a mixture thereof.

In some examples, the polymers described herein can include a either a nitrogen moiety or a sulphur moiety. Either or both of the nitrogen moiety or sulphur moiety can independently range from about 0.1 wt %/o to about 50 wt % of the polymer, about 5 wt % to about 10 wt %, less than, equal to, or greater than about 0.1 wt %, 0.5, 1, 1.5, 2, 2.5, 3, 3.5, 4, 4.5, 5, 5.5, 6, 6.5, 7, 7.5, 8, 8.5, 9, 9.5, and 10 wt % of the polymer.

In some examples, interlayer 212 can include a plurality of nanoparticles interspersed with the one or more polymers. The nanoparticles can range from about 0.1 wt % to about 95 wt % of the interlayer, about 5 wt % to about 20 wt %/o, less than, equal to, or greater than about 0.1 wt %, 0.5, 1, 1.5, 2, 2.5, 3, 3.5, 4, 4.5, 5, 10, 15, 20, 25, 30, 35, 40, 45, 50, 55, 60, 65, 70, 75, 80, 85, 90, or 95 wt %.

Figure 3:
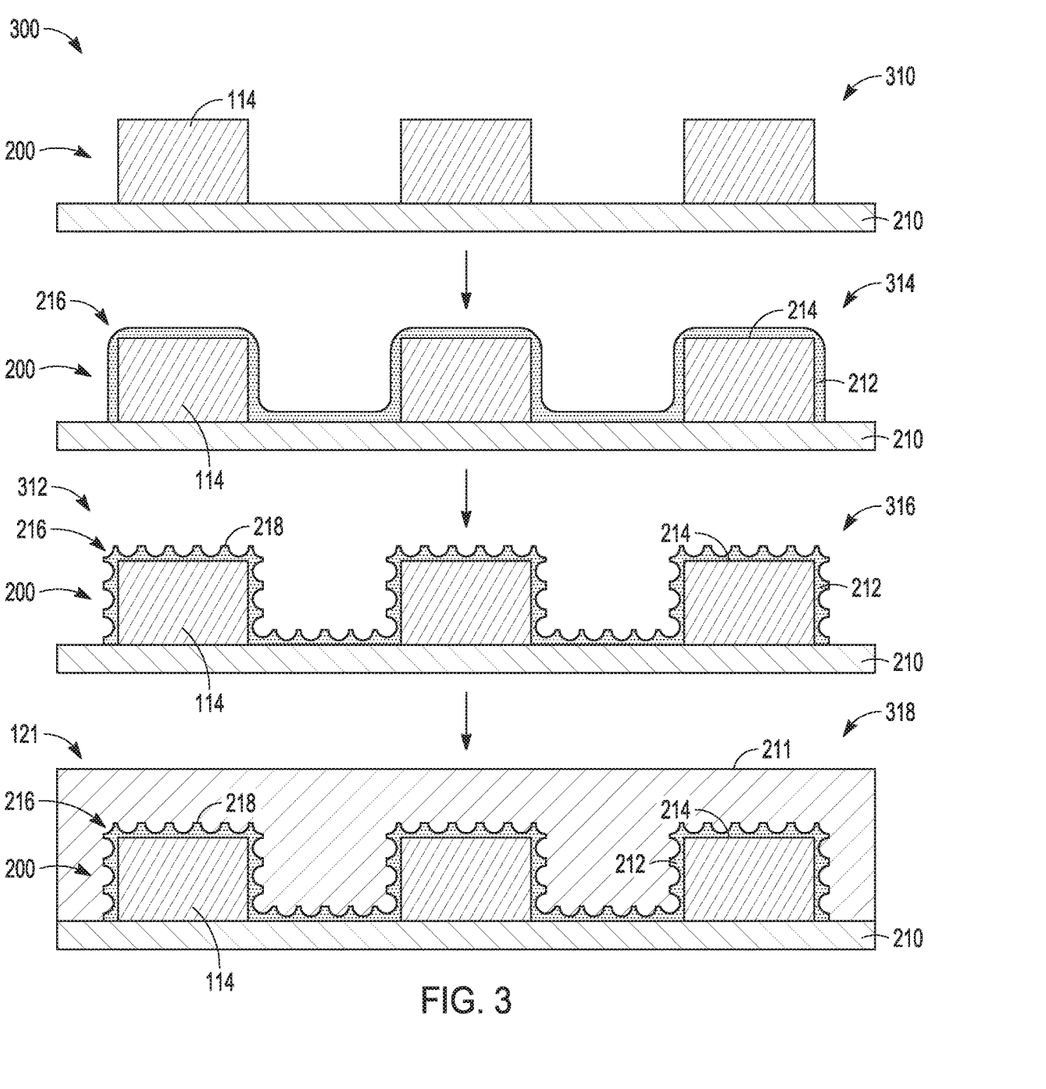
FIG. 3 is a schematic diagram illustrating a method of making the substrate of FIG. 2, in accordance with various embodiments.

Substrate 121 can be formed according to many suitable ways. An example of a method of forming substrate 121 is shown in FIG. 3. FIG. 3 is a schematic diagram showing method 300. As shown in operation 310, substrate precursor 312 is provided. Substrate precursor 312 includes traces 114 disposed on a dielectric material. Traces 114 can be built on the dielectric material by depositing a seed layer (e.g., a copper seed layer) on the dielectric material and applying voltage to grow traces 114.

As described herein, traces 114 have a surface roughness ranging from about 0.5 nm to about 100 nm. The exact surface roughness of traces 114 can be tuned by altering the conditions under which traces 114 are grown. Traces 114 are coated with interlayer 212 at operation 314. Method 300 can optionally be free of any step involving roughing traces 114. The components of interlayer 212 (e.g., the one or more polymers or nanoparticles) can be deposited on trace 114 and optionally cured thereon. Curing can be non-partial or complete. Curing can be accomplished through thermocuring or light curing. In thermocuring the material can be cured at any suitable temperature depending on the material. In light curing the material can exposed a light source (e.g., ultra violet, infrared, or visible light) for any suitable amount of time. Interlayer 212 can also be annealed to trace 114.

Following operation 314, interlayer 212 is roughed at operation 316. While not so limited, interlayer 212, specifically second surface 216, can be roughed through a wet treatment etching or a dry etching. To accomplish wet treatment etching, substrate precursor 312 can be exposed to an etchant. The etchant can either be directly applied to interlayer 212 or substrate precursor 312 can be emerged in a solution including the etchant. The substrate precursor can be exposed to the etchant for any suitable amount of time, depending in part on the properties of the material forming interlayer 212 and those of the etchant. A mask can further be applied to second surface 216 to prevent certain areas from being etched.

The choice of etchant is driven by the material of interlayer 212. As understood an "etchant" refers to a material or composition capable of removing at least a portion of the material of interlayer 212. In some embodiments etching includes swelling (e.g., with an organic solvent) the material of interlayer 212 followed by etching with and etchant. While not so limited, examples of a suitable etchants can include $KMnO_4$ Other non-limiting examples a mixture of M NaClO and M NaOH; M NaOH; KOH; a mixture of M NaOH and $C_2H_5OH$; a mixture of $H_2O_4$ and $K_2Cr_2O_7$; $H_2O_2$; NaClO; a mixture of NaOH, and a disodium salt or dodecyl (sulfophenoxy) benzene-sulfonic acid; a mixture of $H_2O_2$ and $CrO_3$; or mixtures thereof. In a dry etching process, interlayer 212 can be etched with a laser or a plasma source.

Interlayer 212 can be etched to form any predetermined pattern in interlayer 212 having any desired surface roughness. Following etching, a second layer of dielectric material is coated over second surface 216 at operation 318. As the second layer of dielectric material is coated over second surface 216, the dielectric material fills the voids, gaps, or undulations of second surface 216, which can be formed by protrusions 218. This creates a mechanical interlock between interlayer 212 and the dielectric material. The mechanical interlock can strengthen the connection between traces 114 by providing a good connection therebetween. Moreover, the low surface roughness of traces 114, as compared to a corresponding trace that is free of interlayer 212, leads to a reduction of loss of signal from traces 114 as compared to the corresponding trace.

Figure 4:
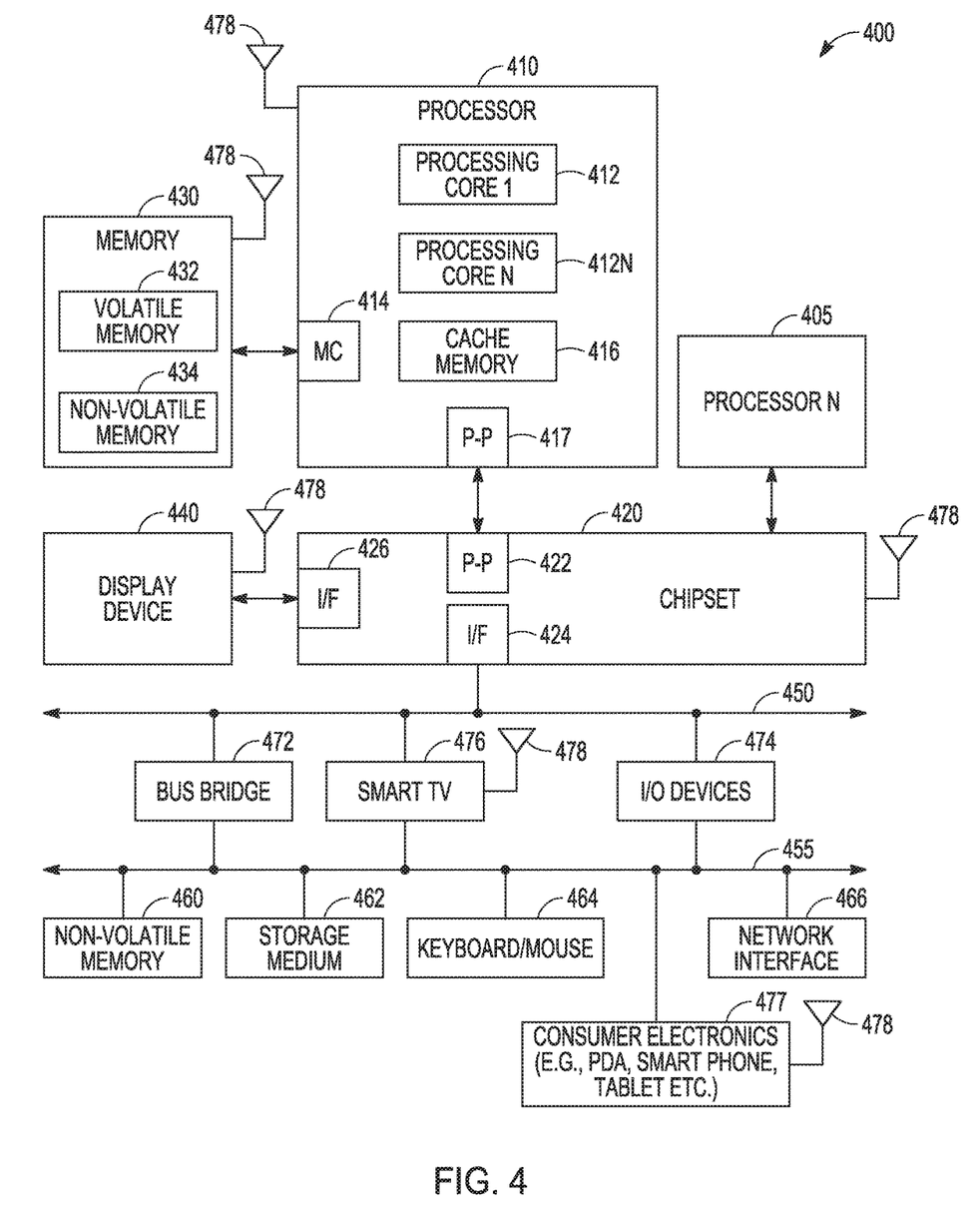
FIG. 4 is block diagram of an electronic system, in accordance with various embodiments.

FIG. 4 illustrates a system level diagram, according to an embodiment of the disclosure. For instance, FIG. 4 depicts an example of an electronic device (e.g., system) including integrated circuit package assembly 100. FIG. 4 is included to show an example of a higher level device application for the present disclosure. In an embodiment, system 400 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 400 is a SOC system.

In an embodiment, processor 410 has one or more processing cores 412 and 412N, where 412N represents the Nth processor core inside processor 410 where N is a positive integer. In an embodiment, system 400 includes multiple processors including 410 and 405, where processor 405 has logic similar or identical to the logic of processor 410. In some embodiments, processing core 412 includes, but is not limited to, pre-fetch logic to fetch instructions, decode logic to decode the instructions, execution logic to execute instructions and the like. In some embodiments, processor 410 has a cache memory 416 to cache instructions and/or data for system 400. Cache memory 416 may be organized into a hierarchal structure including one or more levels of cache memory.

In some embodiments, processor 410 includes a memory controller 414, which is operable to perform functions that enable the processor 410 to access and communicate with memory 430, which includes a volatile memory 432 and/or a non-volatile memory 434. In some embodiments, processor 410 is coupled with memory 430 and chipset 420. Processor 410 may also be coupled to a wireless antenna 478 to communicate with any device configured to transmit and/or receive wireless signals. In an embodiment, the wireless antenna 478 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 432 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 434 includes, but is not limited to, flash memory, phase change memory (PCM), read-only memory (ROM), electrically erasable programmable read-only memory (EEPROM), or any other type of non-volatile memory device.

Memory 430 stores information and instructions to be executed by processor 410. In an embodiment, memory 430 may also store temporary variables or other intermediate information while processor 410 is executing instructions. In the illustrated embodiment, chipset 420 connects with processor 410 via Point-to-Point (PtP or P-P) interfaces 417 and 422. Chipset 420 enables processor 410 to connect to other elements in system 400. In some embodiments of the disclosure, interfaces 417 and 422 operate in accordance with a PtP communication protocol such as the Intel® QuickPath Interconnect (QPI) or the like. In other embodiments, a different interconnect may be used.

In some embodiments, chipset 420 is operable to communicate with processor 410, 405N, display device 440, and other devices 472, 476, 474, 460, 462, 464, 466, 477, and the like. Chipset 420 may also be coupled to a wireless antenna 478 to communicate with any device configured to transmit and/or receive wireless signals.

Chipset 420 connects to display device 440 via interface 426. Display 440 may be, for example, a liquid crystal display (LCD), a plasma display, cathode ray tube (CRT) display, or any other form of visual display device. In some embodiments of the disclosure, processor 410 and chipset 420 are merged into a single SOC. In addition, chipset 420 connects to one or more buses 450 and 455 that interconnect various elements 474, 460, 462, 464, and 466. Buses 450 and 455 may be interconnected together via a bus bridge 472. In an embodiment, chipset 420 couples with a non-volatile memory 460, a mass storage device(s) 462, a keyboard/mouse 464, and a network interface 466 via interface 424 and/or 404, smart television (TV) 476, consumer electronics 477, and the like In an embodiment, mass storage device 462 includes, but is not limited to, a solid state drive, a hard disk drive, a universal serial bus flash memory drive, or any other form of computer data storage medium. In an embodiment, network interface 466 is implemented by any type of well known network interface standard including, but not limited to, an Ethernet interface, a universal serial bus (USB) interface, a Peripheral Component Interconnect (PCI)

Express interface, a wireless interface and/or any other suitable type of interface. In an embodiment, the wireless interface operates in accordance with, but is not limited to, the IEEE 802.11 standard and its related family, HPAV, UWB, Bluetooth, WiMax, or any form of wireless communication protocol.

While the modules shown in FIG. 4 are depicted as separate blocks within the system 400, the functions performed by some of these blocks may be integrated within a single semiconductor circuit or may be implemented using two or more separate integrated circuits. For example, although cache memory 416 is depicted as a separate block within processor 410, cache memory 416 (or selected aspects of 416) may be incorporated into processor core 412.

Additional Embodiments

The following exemplary embodiments are provided, the numbering of which is not to be construed as designating levels of importance:

Embodiment 1 provides a substrate for an integrated circuit, the substrate comprising:
 a dielectric layer;
 a plurality of conductive elements at least partially embedded within the dielectric layer and having an outer surface; and
 an interlayer disposed between the individual conductive elements and the dielectric layer, the interlayer having a first surface comprising a plurality of protrusions interlocked with the dielectric layer and a second surface adhered to the outer surface of the individual conductive elements.

Embodiment 2 provides the substrate of Embodiment 1, wherein the dielectric layer comprises a dielectric material.

Embodiment 3 provides the substrate of Embodiment 2, wherein the dielectric material ranges from about 50 wt % to about 100 wt % of the dielectric layer.

Embodiment 4 provides the substrate of any one of Embodiments 1 or 3, wherein the dielectric material ranges from about 95 wt % to about 100 wt % of the dielectric layer.

Embodiment 5 provides the substrate of any one of Embodiments 1-4, wherein the dielectric material is chosen from an epoxy laminate, polytetrafluoroethylene, phenolic cotton pater, woven glass, or mixtures thereof.

Embodiment 6 provides the substrate of any one of Embodiments 1-5, wherein the dielectric layer comprises a plurality of individual layers of the dielectric material Embodiment 7 provides the substrate of Embodiment 6, wherein the individual layers of the dielectric material comprise different dielectric materials.

Embodiment 8 provides the substrate of Embodiment 6, wherein the individual layers of the dielectric material comprise the same dielectric material.

Embodiment 9 provides the substrate of any one of Embodiments 1-8, wherein the conductive material includes a metal.

Embodiment 10 provides the substrate of Embodiment 9, wherein the metal ranges from about 50 wt % to about 100 wt % of the conductive material.

Embodiment 11 provides the substrate of any one of Embodiments 9 or 10, wherein the metal ranges from about 95 wt % to about 100 wt % of the conductive material.

Embodiment 12 provides the substrate of any one of Embodiments 9-11, wherein the metal is copper.

Embodiment 13 provides the substrate of any one of Embodiments 1-12, wherein a root mean square roughness of the conductive material outer layer ranges from about 0.5 nm to about 100 nm.

Embodiment 14 provides the substrate of any one of Embodiments 1-13, wherein a root mean square roughness of the conductive material outer layer ranges from about 5 nm to about 15 nm.

Embodiment 15 provides the substrate of any one of Embodiments 1-14, wherein a portion the individual conductive elements are free of the interlayer.

Embodiment 16 provides the substrate of any one of Embodiments 1-15, wherein the interlayer comprises one or more polymers.

Embodiment 17 provides the substrate of Embodiment 16, wherein the one or more polymers range from about 50 wt % to about 100 wt % of the interlayer.

Embodiment 18 provides the substrate of Embodiment 16, wherein the one or more polymers range from about 95 wt % to about 100 wt % of the interlayer.

Embodiment 19 provides the substrate of any one of Embodiments 16-18, wherein the one or more polymers are chosen from a polyurethane, a polycarbonate, a polyamide, a polyimide, a polysiloxane, a polyacrylate, a cis-1,4-polyisoprene, an epoxy resin, a copolymer thereof, or a mixture thereof.

Embodiment 20 provides the substrate of Embodiment 19, wherein the polyacryalte is chosen from a methacrylate, a methyl acrylate, an ethyl acrylate, a 2-cholroethyl vinyl ether, a 2-ethylhexyl acrylate, a hydroxyethyl methacrylate, a butyl acrylate, a butyl methacrylate, a polymethyl methacrylate, a copolymer thereof, or a mixture thereof.

Embodiment 21 provides the substrate of Embodiment 19, wherein the polyimide is formed according to a reaction of at least one of:
 a dianhydride monomer and a diamine monomer; and
 a dianhydride monomer and a disocynate monomer.

Embodiment 22 provides the substrate of Embodiment 19, wherein the polycarbonate is formed according to a reaction of a bisphonol A monomer and a phosgene monomer.

Embodiment 23 provides the substrate of Embodiment 19, wherein the polyamide is chosen from an aliphatic polyamide, a polyphtalamide, an aramide, a copolymer thereof, or a mixture thereof.

Embodiment 24 provides the substrate of Embodiment 19, wherein the polysiloxane is polydimethylsiloxane.

Embodiment 25 provides the substrate of Embodiment 19, wherein the cis-1,4-polyisoprene comprises at least one nitrogen moiety and sulphur moiety.

Embodiment 26 provides the substrate of Embodiment 25, wherein at least one of the nitrogen moiety and the sulphur moiety range from about 0.1 wt % to about 20 wt % of the cis-1,4-polyisoprene.

Embodiment 27 provides the substrate of Embodiment 25, wherein the epoxy resin is chosen from bisphenol A epoxy resin, a bisphenol F epoxy resin, a novolac epoxy resin, an aliphatic epoxy resin, a glycidylamine epoxy resin, or mixtures thereof.

Embodiment 28 provides the substrate of Embodiment 25, wherein the epoxy resin is polymerized in the presence of a hardener chosen from a primary amine, an anhydride, a polyphenol, a thiol, or a mixture thereof.

Embodiment 29 provides the substrate of Embodiment 25, wherein the epoxy resin includes an end group chosen from an amine, an anhydride, a polyphenol, a thiol, or a mixture thereof.

Embodiment 30 provides the substrate of Embodiment 19, wherein the interlayer further comprises nanosilica particles.

Embodiment 31 provides the substrate of Embodiment 30, wherein the nanosilica particles range from about 0.1 wt % to about 20 wt % of the interlayer.

Embodiment 32 provides the substrate of Embodiment 30, wherein the nanosilica particles range from about 0.1 wt % to about 5 wt % of the interlayer.

Embodiment 33 provides the substrate of any one of Embodiments 1-32, wherein a thickness of the interlayer ranges from about 0.1 µm to about 10 µm.

Embodiment 34 provides an integrated circuit comprising:
a substrate comprising:
a dielectric layer;
a plurality of copper elements at least partially embedded within the dielectric layer and having an outer surface;
an interlayer disposed between the individual conductive elements and the dielectric layer, the interlayer having a first surface comprising a plurality of protrusions interlocked with the dielectric layer and a second surface adhered to the outer surface of the individual conductive elements,
wherein the dielectric layer and the interphase layer comprise a different material; and
an electrical component in electronic communication with at least one of the copper elements.

Embodiment 35 provides the integrated circuit of Embodiments 34, wherein the electrical component is chosen from a die, a capacitor, a resistor, or a transistor.

Embodiment 36 provides the integrated circuit of any one of Embodiments 34 or 35, wherein the dielectric layer comprises a dielectric material.

Embodiment 37 provides the integrated circuit of Embodiment 36, wherein the dielectric material ranges from about 50 wt % to about 100 wt % of the dielectric layer.

Embodiment 38 provides the integrated circuit of any one of Embodiments 36 or 37, wherein the dielectric material ranges from about 95 wt % to about 100 wt % of the dielectric layer.

Embodiment 39 provides the integrated circuit of any one of Embodiments 36-38, wherein the dielectric material is chosen from an epoxy laminate, polytetrafluoroethylene, phenolic cotton pater, woven glass, or mixtures thereof.

Embodiment 40 provides the integrated circuit of any one of Embodiments 36-39, wherein the dielectric layer comprises a plurality of individual layers of the dielectric material Embodiment 41 provides the integrated circuit of Embodiment 40, wherein the individual layers of the dielectric material comprise different dielectric materials.

Embodiment 42 provides the integrated circuit of Embodiment 40, wherein the individual layers of the dielectric material comprise the same dielectric material.

Embodiment 43 provides the integrated circuit of any one of Embodiments 1-42, wherein the conductive material includes a metal.

Embodiment 44 provides the integrated circuit of Embodiment 43, wherein the metal ranges from about 50 wt % to about 100 wt % of the conductive material.

Embodiment 45 provides the integrated circuit of any one of Embodiments 43 or 44, wherein the metal ranges from about 95 wt % to about 100 wt % of the conductive material.

Embodiment 46 provides the integrated circuit of any one of Embodiments 43-45, wherein the metal is copper.

Embodiment 47 provides the integrated circuit of any one of Embodiments 1-46, wherein a root mean square roughness of the conductive material outer layer ranges from about 0.5 nm to about 100 nm.

Embodiment 48 provides the integrated circuit of any one of Embodiments 1-47, wherein a root mean square roughness of the conductive material outer layer ranges from about 5 nm to about 15 nm.

Embodiment 49 provides the integrated circuit of Embodiment 48, wherein the portion of the individual conductive elements that define a portion of an outer surface of the substrate are free of the interlayer.

Embodiment 50 provides the integrated circuit of any one of Embodiments 1-49, wherein the interlayer comprises one or more polymers or a material deposited through at least one of chemical vapor deposition and physical chemical deposition.

Embodiment 51 provides the integrated circuit of Embodiment 50, wherein the one or more polymers or a material deposited through at least one of chemical vapor deposition and physical chemical deposition range from about 50 wt % to about 100 wt % of the interlayer.

Embodiment 52 provides the integrated circuit of Embodiment 50, wherein the one or more polymers or a material deposited through at least one of chemical vapor deposition and physical chemical deposition range from about 95 wt % to about 100 wt % of the interlayer.

Embodiment 53 provides the integrated circuit of any one of Embodiments 50-52, wherein the one or more polymers are chosen from a polyurethane, a polycarbonate, a polyamide, a polyimide, a polysiloxane, a polyacrylate, a cis-1,4-polyisoprene, an epoxy resin, a copolymer thereof, or a mixture thereof.

Embodiment 54 provides the integrated circuit of Embodiment 53, wherein the polyacryalte is chosen from a methacrylate, a methyl acrylate, an ethyl acrylate, a 2-cholroethyl vinyl ether, a 2-ethylhexyl acrylate, a hydroxyethyl methacrylate, a butyl acrylate, a butyl methacrylate, a polymethyl methacrylate, a copolymer thereof, or a mixture thereof.

Embodiment 55 provides the integrated circuit of Embodiment 53, wherein the polyimide is formed according to a reaction of at least one of:
a dianhydride monomer and a diamine monomer; and
a dianhydride monomer and a disocynate monomer.

Embodiment 56 provides the integrated circuit of Embodiment 53, wherein the polycarbonate is formed according to a reaction of a bisphonol A monomer and a phosgene monomer.

Embodiment 57 provides the integrated circuit of Embodiment 53, wherein the polyamide is chosen from an aliphatic polyamide, a polyphtalamide, an aramide, a copolymer thereof, or a mixture thereof.

Embodiment 58 provides the integrated circuit of Embodiment 53, wherein the polysiloxane is polydimethylsiloxane.

Embodiment 59 provides the integrated circuit of Embodiment 53, wherein the one or more polymers comprises at least one nitrogen moiety and sulphur moiety.

Embodiment 60 provides the integrated circuit of Embodiment 59, wherein at least one of the nitrogen moiety and the sulphur moiety range from about 0.1 wt % to about 20 wt % of the one or more polymers.

Embodiment 61 provides the integrated circuit of Embodiment 59, wherein the epoxy resin is chosen from bisphenol A epoxy resin, a bisphenol F epoxy resin, a novolac epoxy resin, an aliphatic epoxy resin, a glycidylamine epoxy resin, or mixtures thereof.

Embodiment 62 provides the integrated circuit of Embodiment 59, wherein the epoxy resin is polymerized in the presence of a hardener chosen from a primary amine, an anhydride, a polyphenol, a thiol, or a mixture thereof.

Embodiment 63 provides the integrated circuit of Embodiment 59, wherein the epoxy resin includes an end group chosen from an amine, an anhydride, a polyphenol, a thiol, or a mixture thereof.

Embodiment 64 provides the integrated circuit of any one of Embodiments 1-63, wherein the interlayer further comprises nanosilica particles.

Embodiment 65 provides the integrated circuit of Embodiment 64, wherein the nanosilica particles range from about 0.1 wt % to about 20 wt % of the interlayer.

Embodiment 66 provides the integrated circuit of Embodiment 65, wherein the nanosilica particles range from about 0.1 wt % to about 80 wt % of the interlayer.

Embodiment 67 provides the integrated circuit of any one of Embodiments 1-66, wherein a thickness of the interlayer ranges from about 0.1 μm to about 10 μm.

Embodiment 68 provides a method of making a substrate for an integrated circuit, the method comprising:
at least partially coating an outer surface of a conductive element with an interlayer material;
roughing a first surface of the interlayer material; and
at least partially coating the first surface of the interlayer material with a dielectric material.

Embodiment 69 provides the method of Embodiment 68, wherein the conductive material includes a metal.

Embodiment 70 provides the method of Embodiment 69, wherein the metal ranges from about 50 wt % to about 100 wt % of the conductive material.

Embodiment 71 provides the method of any one of Embodiments 69 or 70, wherein the metal ranges from about 95 wt %/o to about 100 wt % of the conductive material.

Embodiment 72 provides the method of any one of Embodiments 69-71, wherein the metal is copper.

Embodiment 73 provides the method of any one of Embodiments 69-72, wherein a root mean square roughness of the conductive material outer layer ranges from about 0.5 nm to about 100 nm.

Embodiment 74 provides the method of any one of Embodiments 69-73, wherein a root mean square roughness of the conductive material outer layer ranges from about 5 nm to about 15 nm.

Embodiment 75 provides the method of any one of Embodiments 69-73, wherein the interlayer comprises one or more polymers or a material deposited through at least one of chemical vapor deposition and physical chemical deposition.

Embodiment 76 provides the method of Embodiment 75, wherein the one or polymers or a material deposited through at least one of chemical vapor deposition and physical chemical deposition range from about 50 wt % to about 100 wt % of the interlayer.

Embodiment 77 provides the method of Embodiment 75, wherein the one or polymers or a material deposited through at least one of chemical vapor deposition and physical chemical deposition range from about 95 wt % to about 100 wt % of the interlayer.

Embodiment 78 provides the method of any one of Embodiments 75-77, wherein the one or more polymers are chosen from a polyurethane, a polycarbonate, a polyamide, a polyimide, a polysiloxane, a polyacrylate, a cis-1,4-polyisoprene, an epoxy resin, a copolymer thereof, or a mixture thereof.

Embodiment 79 provides the method of Embodiment 78, wherein the polyacryalte is chosen from a methacrylate, a methyl acrylate, an ethyl acrylate, a 2-cholroethyl vinyl ether, a 2-ethylhexyl acrylate, a hydroxyethyl methacrylate, a butyl acrylate, a butyl methacrylate, a polymethyl methacrylate, a copolymer thereof, or a mixture thereof.

Embodiment 80 provides the method of Embodiment 78, wherein the polyimide is formed according to a reaction of at least one of:
a dianhydride monomer and a diamine monomer; and
a dianhydride monomer and a disocynate monomer.

Embodiment 81 provides the method of Embodiment 78, wherein the polycarbonate is formed according to a reaction of a bisphonol A monomer and a phosgene monomer.

Embodiment 82 provides the method of Embodiment 78, wherein the polyamide is chosen from an aliphatic polyamide, a polyphtalamide, an aramide, a copolymer thereof or a mixture thereof.

Embodiment 83 provides the method of Embodiment 78, wherein the polysiloxane is polydimethylsiloxane.

Embodiment 84 provides the method of any one of Embodiments 75-83, wherein the or a material deposited through at least one of chemical vapor deposition and physical chemical deposition comprises at least one nitrogen moiety and sulphur moiety.

Embodiment 85 provides the method of Embodiment 84, wherein at least one of the nitrogen moiety and the sulphur moiety range from about 0.1 wt % to about 20 wt % of the cis-1,4-polyisoprene.

Embodiment 86 provides the method of Embodiment 84, wherein the epoxy resin is chosen from bisphenol A epoxy resin, a bisphenol F epoxy resin, a novolac epoxy resin, an aliphatic epoxy resin, a glycidylamine epoxy resin, or mixtures thereof.

Embodiment 87 provides the method of Embodiment 84, wherein the epoxy resin is polymerized in the presence of a hardener chosen from a primary amine, an anhydride, a polyphenol, a thiol, or a mixture thereof.

Embodiment 88 provides the method of Embodiment 84, wherein the epoxy resin includes an end group chosen from an amine, an anhydride, a polyphenol, a thiol, or a mixture thereof.

Embodiment 89 provides the method of any one of Embodiments 69-88, wherein the interlayer further comprises nanosilica particles.

Embodiment 90 provides the method of Embodiment 89, wherein the nanosilica particles range from about 0.1 wt %/o to about 80 wt % of the interlayer.

Embodiment 91 provides the method of Embodiment 89, wherein the nanosilica particles range from about 5 wt % to about 20 wt % of the interlayer.

Embodiment 92 provides the method of any one of Embodiments 1-91, wherein a thickness of the interlayer ranges from about 0.1 μm to about 10 μm.

Embodiment 93 provides the method of any one of Embodiments 69-92, wherein rouging the first surface of the interlayer material comprises at least one of wet etching or dry etching.

Embodiment 94 provides the method of Embodiment 93, wherein dry etching comprises laser etching the first surface.

Embodiment 95 provides the method of Embodiment 93, wherein wet etching comprises contacting the first surface of the interlayer with an etchant.

Embodiment 96 provides the method of Embodiment 95, wherein the liquid etchant is chosen from:
a mixture of NaClO and NaOH;
M NaOH;
KOH;
$KMnO_4$;
a mixture of NaOH and $C_2H_5OH$;

a mixture of $H_2O_4$ and $K_2Cr_2O_7$;
$H_2O_2$;
NaClO;
a mixture of NaOH, and a disodium salt or dodecyl (sulfophenoxy) benzene-sulfonic acid;
a mixture of $H_2O_2$ and $CrO_3$;
or mixtures thereof.

Embodiment 97 provides the method of any one of Embodiments 69-96, wherein a surface area of the first surface after roughing is greater than a surface area of the first surface before roughing.

Embodiment 98 provides the method of any one of Embodiments 69-97, wherein a root mean square roughness of the first surface after roughing ranges from about 100 nm to about 5000 nm.

Embodiment 99 provides the method of any one of Embodiments 69-98, further comprising laminating a dielectric layer to the first surface of the interlayer.

Embodiment 100 provides the method of Embodiment 99, wherein the dielectric layer is mechanically interlocked with the first surface of the interlayer.

What is claimed is:

1. A substrate for an integrated circuit, the substrate comprising:
   a dielectric layer;
   a plurality of conductive elements at least partially embedded within the dielectric layer and having an outer surface; and
   an interlayer disposed between the individual conductive elements and the dielectric layer, the interlayer having a first surface comprising a plurality of protrusions interlocked with the dielectric layer and a second surface adhered to the outer surface of individual conductive elements of the plurality of conductive elements, the interlayer comprising one or more polymers are chosen from a polyurethane, a polycarbonate, a polyamide, a polyimide, a polysiloxane, a polyacrylate, a cis-1,4-polyisoprene, an epoxy resin, a copolymer thereof, or a mixture thereof.

2. The substrate of claim 1, wherein the dielectric layer comprises a dielectric material.

3. The substrate of claim 2, wherein the dielectric material is chosen from an epoxy laminate, polytetrafluoroethylene, phenolic cotton pater, woven glass, or mixtures thereof.

4. The substrate of claim 3, wherein the conductive element includes a metal.

5. The substrate of claim 4, wherein the metal is copper.

6. The substrate of claim 1, wherein a root mean square roughness of the conductive element outer layer ranges from 0.5 nm to 100 nm.

7. An integrated circuit comprising:
   a substrate comprising:
   a dielectric layer;
   a plurality of copper elements at least partially embedded within the dielectric layer and having an outer surface; and
   an interlayer disposed between individual copper elements of the plurality of copper elements and the dielectric layer, the interlayer having a first surface comprising a plurality of protrusions interlocked with the dielectric layer and a second surface adhered to the outer surface of individual copper elements of the plurality of copper elements, the interlayer comprising one or more polymers are chosen from a polyurethane, a polycarbonate, a polyamide, a polyimide, a polysiloxane, a polyacrylate, a cis-1,4-polyisoprene, an epoxy resin, a copolymer thereof, or a mixture thereof.

8. The integrated circuit of claim 7, wherein a root mean square roughness of the individual copper elements of the plurality of copper elements ranges from 0.5 nm to 100 nm.

9. The integrated circuit of claim 7, wherein a thickness of the interlayer ranges from 0.1 μm to 10 μm.

* * * * *